United States Patent
Barnes

(10) Patent No.: US 8,432,191 B2
(45) Date of Patent: Apr. 30, 2013

(54) PHASE-LOCKED LOOP HAVING HIGH-GAIN MODE PHASE-FREQUENCY DETECTOR

(75) Inventor: Robert Keith Barnes, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 226 days.

(21) Appl. No.: 13/011,989

(22) Filed: Jan. 24, 2011

(65) Prior Publication Data

US 2012/0187989 A1 Jul. 26, 2012

(51) Int. Cl.
*G01R 25/00* (2006.01)
*H03D 13/00* (2006.01)

(52) U.S. Cl.
USPC ..................... 327/3; 327/2; 327/12

(58) Field of Classification Search ................ 327/2, 3, 327/12
See application file for complete search history.

(56) References Cited

U.S. PATENT DOCUMENTS

| | | | |
|---|---|---|---|
| 5,315,269 A | 5/1994 | Fujii | |
| 6,798,296 B2 | 9/2004 | Lin et al. | |
| 6,914,491 B2 | 7/2005 | Derksen | |
| 7,577,225 B2 | 8/2009 | Azadet et al. | |
| 7,940,088 B1 * | 5/2011 | Sampath et al. | 327/3 |
| 7,969,202 B2 * | 6/2011 | Lin et al. | 327/3 |
| 8,058,915 B2 * | 11/2011 | Chiu et al. | 327/156 |

FOREIGN PATENT DOCUMENTS

JP 1253317 A 9/1989

* cited by examiner

*Primary Examiner* — Hai L Nguyen

(57) ABSTRACT

A phase-locked loop (PLL) includes PLL loop circuitry, a frequency divider, and a phase-frequency detector (PFD) that can produce both high-gain output signals to operate the PLL in a high-gain mode and normal output signals to operate the PLL in a normal (not high-gain) mode. A mode signal can be used to switch the PFD between high-gain mode and normal operational mode. When the mode signal indicates high-gain mode, the PFD output signals are extended by one or more additional clock cycles beyond their length when the mode signal indicates normal operational mode.

19 Claims, 11 Drawing Sheets

PHASE-LOCKED LOOP HAVING HIGH-GAIN MODE PHASE-FREQUENCY DETECTOR

BACKGROUND

A phase-locked loop (PLL) is a feedback-based control system that generates an output signal having a phase that, through the feedback loop control, is driven into a fixed phase relationship with an input reference signal. Phase locked loops are used in frequency synthesizers, data transmission and recovery devices, and other applications. As illustrated in FIG. 1, a conventional PLL 10 includes a phase-frequency detector (PFD) 12, a loop filter 14, a voltage-controlled oscillator (VCO) 16, and a frequency divider 18. The PLL 10 outputs a signal (F_OUT) that has a frequency generated by VCO 16. Frequency divider 18 divides the frequency of F_OUT and provides the resulting divided-frequency (clock) signal (DIVCLK) to PFD 12, which also receives a reference clock signal (REFCLK). In response to the reference clock signal and the divided-frequency signal, PFD 12 provides an Up signal and a Down signal to loop filter 14. As described in further detail below, the Up and Down signals are digital pulses. In response to the Up and Down signals, loop filter 14 provides an analog voltage signal (V_CNTRL) that controls the output signal frequency of VCO 16. That is, the frequency of F_OUT is proportional to the analog voltage signal. More specifically, loop filter 14 includes a charge pump or similar circuit that drives current into the filter circuitry in response to the Up signal and draws current from the filter circuitry in response to the Down signal. Accordingly, the difference between the pulse widths of the Up and Down signals (i.e., Up-Down) represents the phase error and controls loop filter 14.

Phase lock is achieved when the rising edge of the divided-frequency clock signal and the rising edge of the reference clock signal are aligned, i.e., corresponding rising edges of the two signals repeatedly occur simultaneously.

As illustrated in FIG. 2, a conventional PFD 12 includes two D-type flip-flops 20 and 22 and a NAND gate 24. Flip-flop 20 outputs the above-referenced Up signal. Flip-flop 22 outputs the above-referenced Down signal. A high or logic-"1" is clocked into flip-flop 20 upon a rising edge of the reference clock signal. A high or logic-"1" is clocked into flip-flop 22 upon a rising edge of the divided-clock signal. When a logic-"1" is clocked into each of flip-flops 20 and 22, NAND gate 24 applies a reset pulse to each of flip-flops 20 and 22, resetting them to a value of logic-"0". Accordingly, in an instance in which the rising edge of the reference clock leads, i.e., occurs before, the rising edge of the divided-frequency clock, PFD 12 generates an Up signal having a pulse width that is proportional to the amount of time by which the rising edge of the reference clock signal leads the rising edge of the divided-frequency clock signal. Conversely, in an instance in which the rising edge of the divided-frequency clock signal leads the rising edge of the reference clock signal, PFD 12 generates a Down signal having a pulse width that is proportional to the amount of time by which the rising edge of the divided-frequency clock signal leads the rising edge of the reference clock signal. The difference between Up and Down pulse widths represents the phase error that loop filter 14 uses to adjust the PLL loop to drive the phase error to zero.

To conserve power in an electronic device such as an integrated circuit, control circuitry in the device can turn off power-consuming circuits such as PLLs when they are not in use. For example, a PLL that is used in a data transmission circuit can be turned off during intervals when data is not being transmitted, such as between bursts of data. However, turning off such a PLL when data is not being transmitted requires that the PLL be powered up and achieve phase lock quickly each time another burst of data is to be transmitted. At least three factors are known to impact PLL power-up time. One such factor is that, as analog circuitry is powered up, time must be allocated for analog voltages and currents to stabilize. Another factor is that the PLL must start the process of frequency and phase locking to the reference clock. Still another factor is that the PLL system response is commonly optimized for a normal operational mode of the PLL (e.g., frequency synthesis, data transmission or recovery, etc.), and the system response that is optimal for the normal operational mode of the PLL is generally not also optimal for the period or mode in which the PLL is powering up and locking to the reference clock, as the loop dynamics (e.g., closed loop bandwidth, damping, etc.) differ during these two modes.

Phase-locked loops having switchable operating characteristics are known. For example, PLLs having adjustable settings are known that allow PLL parameters such as bandwidth and damping to be changed. However, such PLLs commonly only allow tuning of such parameters over a narrow range centered at the values to which the parameters are optimized for the normal operational mode of the PLL. Gain factors of, for example, 50 to 100 are needed to reduce PLL power-up time by an amount that is useful in a data transmission system, but conventional adjustable-gain PLLs can only be adjusted by much smaller gain factors. Adjustable-gain PLLs having a wide adjustment range are known, but they suffer from a number of drawbacks. For example, the very large transistors that are included in some adjustable-gain PLLs consume a large amount of power, occupy a large amount of integrated circuit die area, and induce large parasitic effects such as capacitance and leakage currents that can degrade PLL performance in normal operation.

SUMMARY

Embodiments of the present invention relate to a phase-locked loop (PLL) that includes PLL loop circuitry having one or more paths and a phase-frequency detector (PFD). The PLL loop circuitry provides the PLL output signal in response to Up and Down signals generated by the PFD. The PFD receives a reference clock and an output of the frequency divider representing the PLL output signal divided down in frequency. In an exemplary embodiment of the invention, the PFD also receives a mode signal that can indicate whether the PLL is to operate in a high-gain mode or a normal operational mode.

When the mode signal does not indicate the high-gain mode, i.e., the mode signal indicates normal operational mode of the PLL, the Up signal is defined by a pulse having a starting edge triggered by the reference clock signal edge and having an ending edge triggered by the combination (e.g., logical-AND) of the Up signal being asserted and the Down signal being asserted. Likewise, when the mode signal does not indicate the high-gain mode, the Down signal is defined by a pulse having a starting edge triggered by the divided-clock signal edge and having an ending edge triggered by the combination (e.g., logical-AND) of the Up signal being asserted and the Down signal being asserted.

When the mode signal indicates the high-gain mode and the reference clock signal edge leads the feedback signal edge, the Up signal is defined by a pulse having a starting edge triggered by the reference clock signal edge and having an ending edge triggered by another feedback signal edge following the feedback signal edge. Likewise, when the mode signal indicates the high-gain mode and the feedback signal edge leads the reference clock signal edge the Down signal is defined by a pulse having a starting edge triggered by the feedback signal edge and having an ending edge triggered by another reference clock signal edge following the reference clock signal edge.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 3:
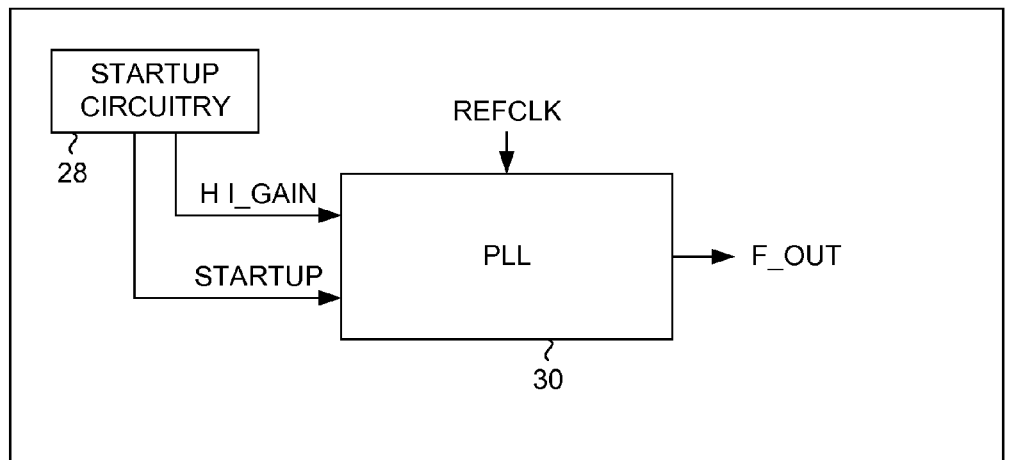
FIG. 3 is a block diagram of an integrated circuit device having a PLL, in accordance with an exemplary embodiment of the invention.

As illustrated in FIG. 3, in an illustrative or exemplary embodiment of the invention, an integrated circuit device 26 includes start-up circuitry 28 and a phase-locked loop (PLL) 30. Although not shown for purposes of clarity, integrated circuit device 26 includes additional circuitry for performing functions that utilize PLL 30. For example, PLL 30 can be utilized in data transmission and recovery circuitry involved in communicating data between integrated circuit device 26 and other (external) devices. PLL 30 can be referred to as operating in its "normal operational mode" when PLL 30 is in operation as part of the data transmission and recovery function. A mode signal (HI_GAIN) indicates whether PLL 30 is to operate in normal operational mode or, alternatively, a high-gain mode. In an exemplary method of operation, described in further detail below, when power is initially applied to PLL 30, start-up circuitry 28 asserts a start-up signal (STARTUP) and the HI_GAIN mode signal, to indicate that PLL 30 is to initially operate in the high-gain mode. After some period of time following assertion of STARTUP and HI_GAIN (for example, on the order of a few tens of nanoseconds to a few hundreds of nanoseconds), startup circuitry 28 can de-assert STARTUP. Because PLL 30 is started up in high-gain mode, PLL 30 can reach phase lock relatively quickly compared with a conventional PLL. After de-asserting STARTUP, start-up circuitry 28 can de-assert HI_GAIN. For example, start-up circuitry 28 can de-assert HI_GAIN after a period of time sufficient for PLL 30 to achieve phase lock (for example, on the order of a few microseconds). Alternatively, start-up circuitry 28 can leave HI_GAIN asserted, so that PLL 30 continues to operate in high-gain mode. It should be noted that although the circuitry that controls PLL 30 in the above-described manner is referred to herein as "start-up" circuitry 28 for purposes of illustrating an exemplary embodiment of the invention, in other embodiments any one or more suitable circuits in integrated circuit device 26 or external to integrated circuit device 26 can control PLL 30 in the manner described or a similar manner.

Figure 1:
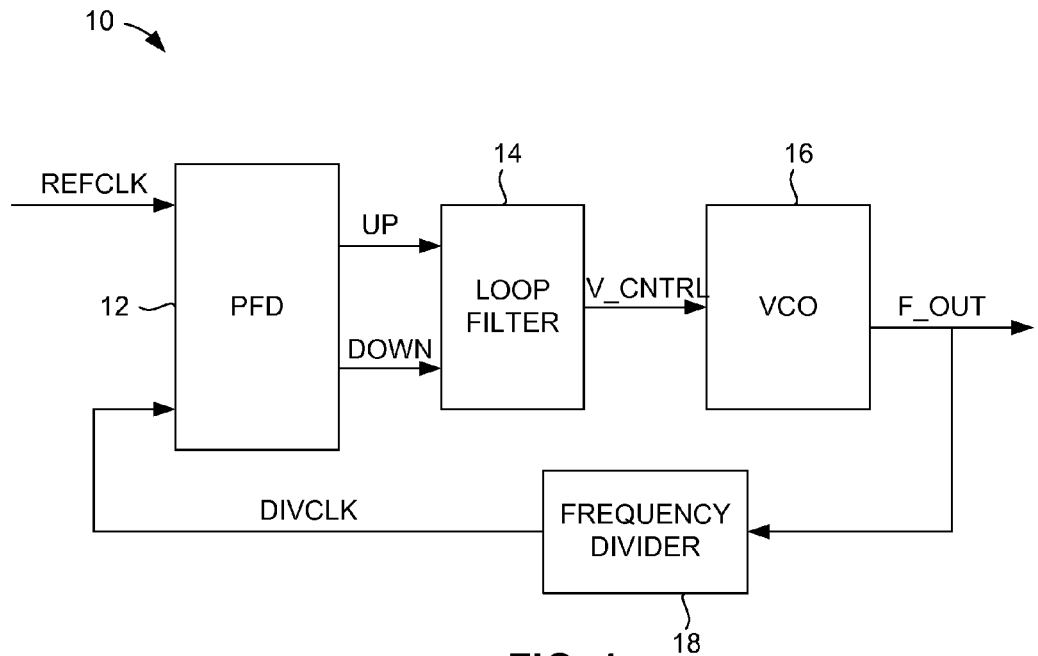
FIG. 1 is a block diagram of a conventional phase-locked loop (PLL), in accordance with the prior art.
Figure 2:
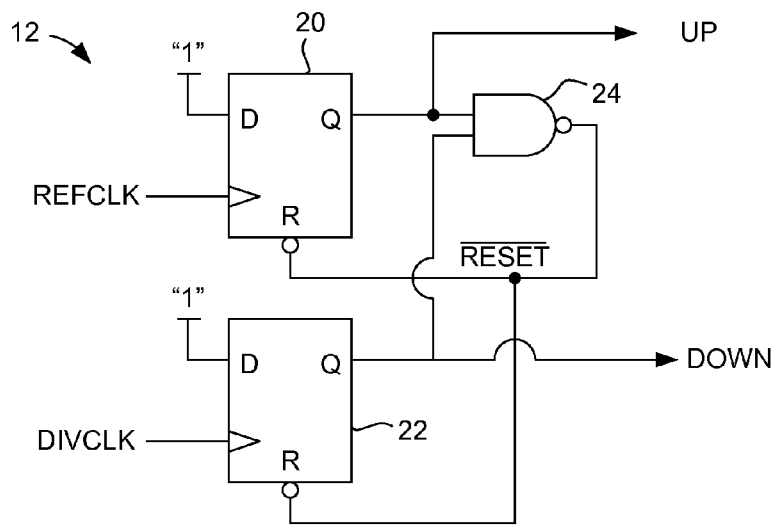
FIG. 2 is a circuit diagram of a conventional phase-frequency detector (PFD) of the PLL of FIG. 1.
Figure 4:
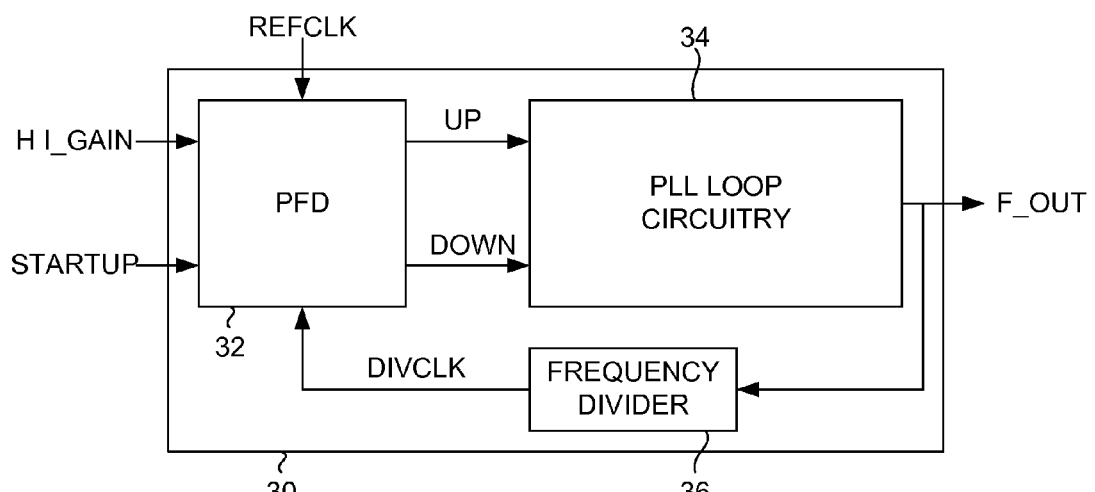
FIG. 4 is a block diagram of the PLL of FIG. 3.

As illustrated in FIG. 4, PLL 30 includes a phase-frequency detector (PFD) 32, PLL loop circuitry 34, and a frequency divider 36. Loop circuitry 34 operates in response to an Up signal and a Down signal provided by PFD 32. Although not individually shown for purposes of clarity, loop circuitry 34 can include a loop filter (which can include a charge pump and filter) and a voltage-controlled oscillator of the types described above with regard to FIG. 1. Loop circuitry 34 produces a PLL output (clock) signal (F_OUT). Frequency divider 36 divides F_OUT in frequency and provides a divided-clock signal (DIVCLK) to PFD 32 as feedback. In addition to DIVCLK, PFD 32 receives a reference clock signal (REFCLK) and the above-referenced STARTUP and HI_GAIN signals as inputs. Although in the exemplary embodiment PLL 30 includes frequency divider 36, in other embodiments of the invention a PLL may not include a frequency divider or may include a similar element that effectively divides the frequency by one or performs some other function in the feedback loop. In other embodiments, the PLL feedback loop circuitry may include additional or different elements.

Figure 5:
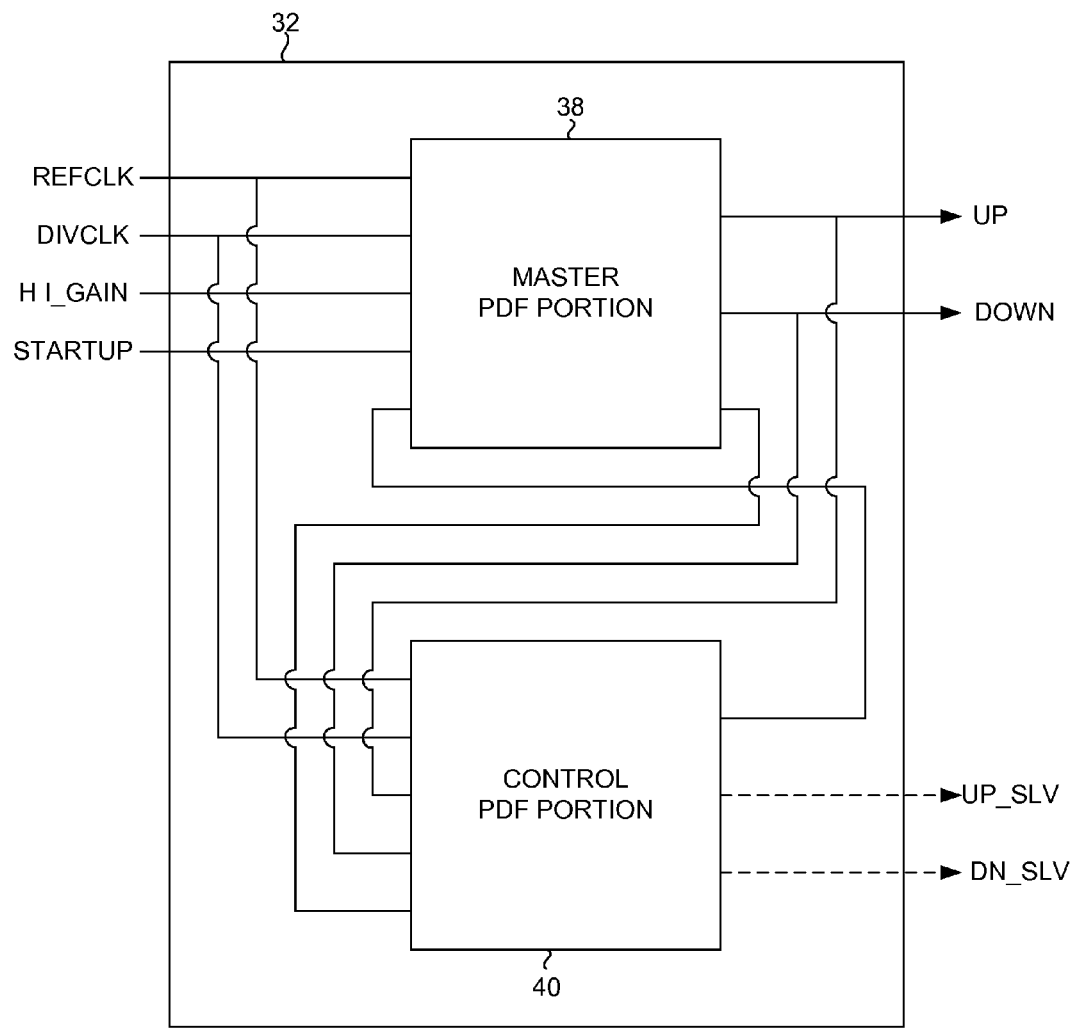
FIG. 5 is a block diagram of the PFD of the PLL of FIG. 3.

As illustrated in FIG. 5, PFD 32 includes a master portion 38 and a slave or control portion 40. As described below in further detail, when HI_GAIN is not asserted (i.e., in normal operational mode), master portion 38 generates the Up and Down signals in a manner similar to that in which a conventional PDF generates such signals, but when HI_GAIN is asserted (i.e., in high-gain mode), master portion 38 generates Up and Down signals that are extended in length (i.e., pulse width) by one or more clock cycles.

Figure 6:
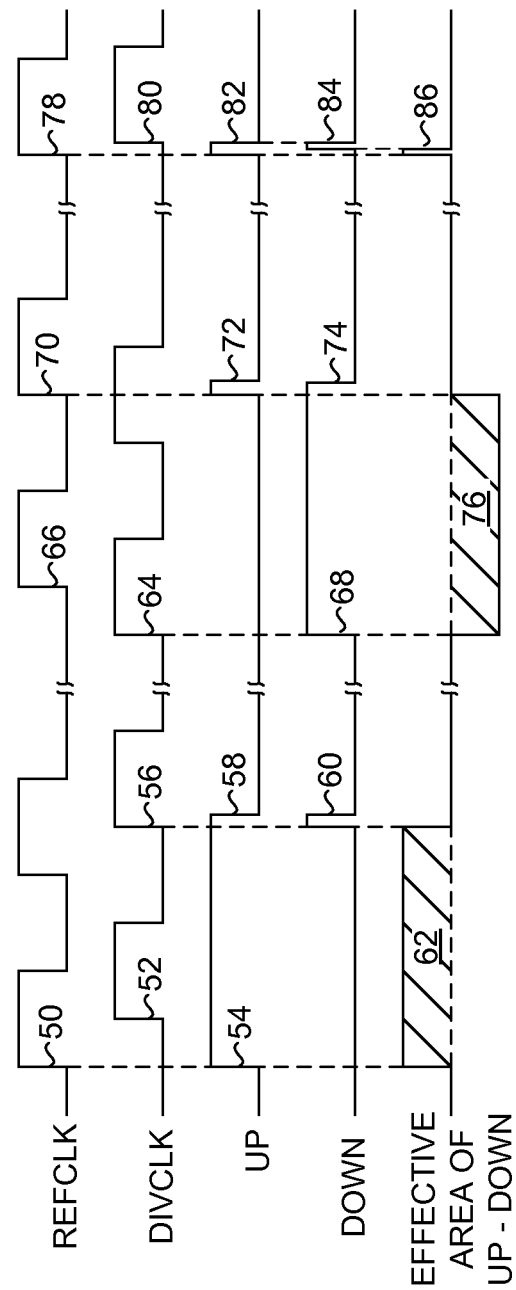
FIG. 6 is a timing diagram, illustrating the operation of the PFD of FIG. 5.

More specifically, as illustrated in FIG. 6, in high-gain mode, in an instance in which a first rising edge 50 of REFCLK leads, i.e., occurs before, a corresponding first rising edge 52 of DIVCLK, master portion 38 causes the Up signal to rise or change to logic-"1" (high) at edge 54 and for the Up signal to remain high until the next or second rising edge 56 of DIVCLK following that first rising edge 52. The second rising edge 56 of DIVCLK triggers the Down signal to go high, and the combination (i.e., logical-AND) of the high Down signal and high Up signal causes both the Up and Down signals reset to low at falling edges 58 and 60, respectively. The relatively large positive effective area or pulse width 62 of the Up signal minus the Down signal results in an error signal that causes loop circuitry 34 (FIG. 4) to substantially increase the frequency of the PLL output signal F_OUT to promote rapidly driving PLL 30 toward achieving phase lock.

Similarly, in high-gain mode, in an instance in which a first rising edge 64 of DIVCLK leads, i.e., occurs before, a corresponding first rising edge 66 of REFCLK, master portion 38 causes the Down signal to rise or change to logic-"1" (high) at edge 68 and for the Down signal to remain high until the next or second rising edge 70 of REFCLK following that first rising edge 66. The second rising edge 70 of REFCLK triggers the Up signal to go high, and the combination of the high Up signal and high Down signal causes both the Up and Down signals reset to low at falling edges 72 and 74, respectively. The relatively large negative effective area or pulse width 76 of the Up signal minus the Down signal causes loop circuitry 34 (FIG. 4) to substantially decrease the frequency of the PLL output signal F_OUT to promote rapidly driving PLL 30 toward achieving phase lock.

In high-gain mode and in an instance in which a rising edge 78 of REFCLK leads a corresponding rising edge 80 of DIVCLK by only a small (phase error) amount, master portion 38 generates the Up and Down signals in a manner similar to that in which a conventional PDF generates such signals. That is, rising edge 78 of REFCLK triggers the Up signal to go high; rising edge 80 of DIVCLK triggers the Down signal to go high; and the combination of the high Up signal and high Down signal causes both the Up and Down signals to reset to low at falling edges 82 and 84, respectively. The relatively small positive effective area or pulse width 86 of the Up signal minus the Down signal causes loop circuitry 34 (FIG. 4) to slightly increase the frequency of the PLL output signal F_OUT to drive PLL 30 toward phase lock. Although not shown for purposes of clarity, in high-gain mode and in an instance in which a rising edge of DIVCLK leads a corresponding rising edge REFCLK by only a small (phase error) amount, the resulting small, negative effective area or pulse width of the Up signal minus the Down signal causes loop circuitry 34 to slightly decrease the frequency of the PLL output signal to drive PLL 30 toward phase lock.

Figure 7:
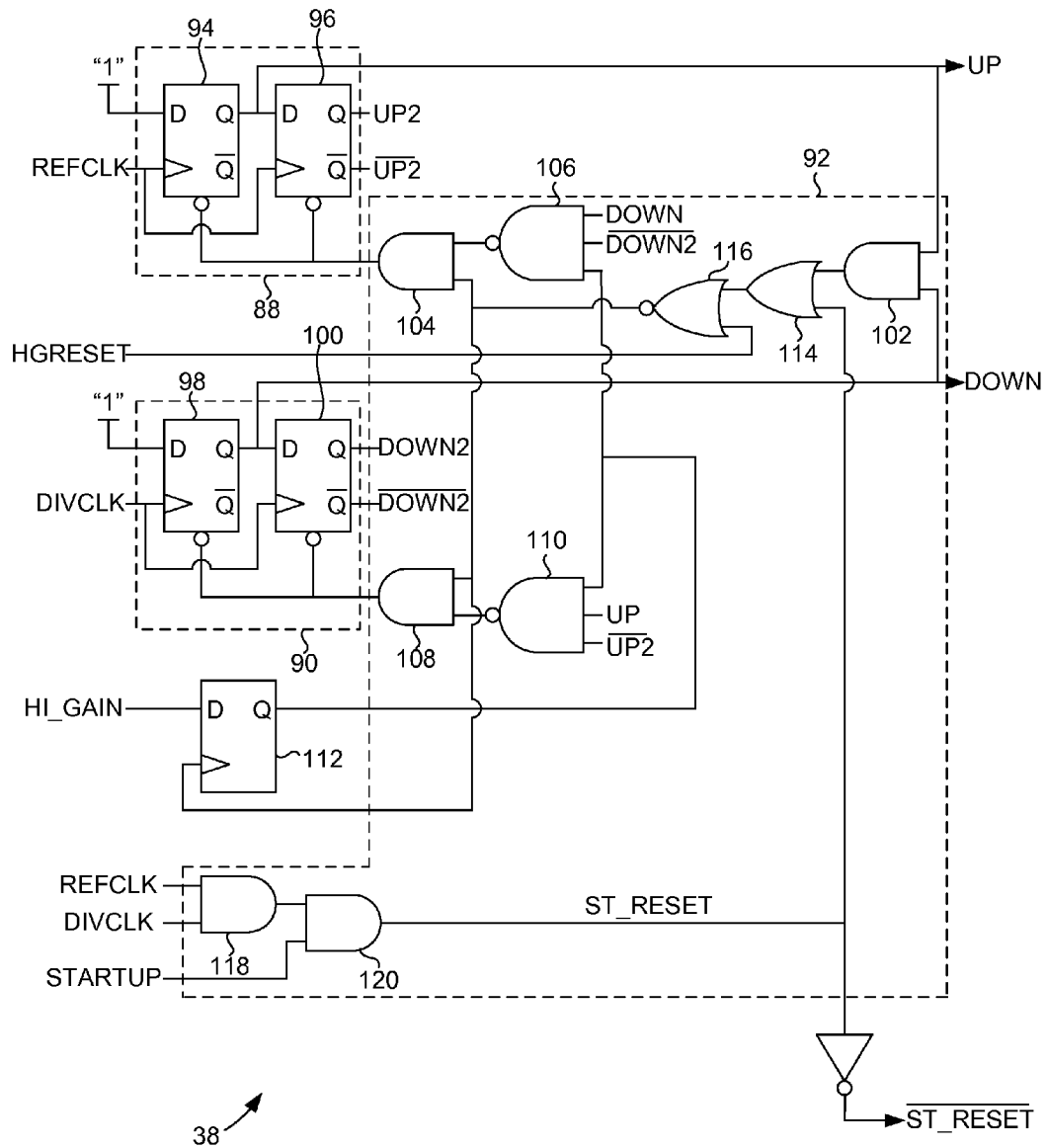
FIG. 7 is a circuit diagram of the master portion of the PFD of FIG. 5.

As illustrated in FIG. 7, master portion 38 includes an Up pulse generator circuit 88, a Down pulse generator circuit 90, and a reset circuit 92. Up pulse generator circuit 88 includes a first flip-flop 94 and a second flip-flop 96. Down pulse generator circuit 90 includes a third flip-flop 98 and a fourth flip-flop 100. First flip-flop 94 is clocked by REFCLK and has a D input tied to a logic-"1" signal. The output of first flip-flop 94, the Up signal, is provided to the D input of second flip-flop 96, which is also clocked by REFCLK. Third flip-flop 98 is clocked by DIVCLK and has a D input tied to a logic-"1" signal. The output of third flip-flop 98, the Down signal, is provided to the D input of fourth flip-flop 100, which is also clocked by DIVCLK.

Reset circuit 92 includes an AND gate 102 through which a reset signal is generated in response to the logical-AND of the Up signal and the Down signal. The reset signal is applied to the Reset inputs of flip-flops 94, 96, 98 and 100. More specifically, through an AND gate 104 and a NAND gate 106, flip-flops 94 and 96 are reset when both the Up signal and Down signal are high or when the Down signal is high and the inverted output of fourth flip-flop 100 is high. Similarly, through an AND gate 108 and a NAND gate 110, flip-flops 98 and 100 are reset when both the Up signal and Down signal are high or when the Up signal is high and the inverted output of second flip-flop 100 is high.

The mode signal HI_GAIN is provided to the D input of a flip-flop 112, which generates a signal to reset flip-flops 94, 96, 98 and 100.

In operation in high-gain mode, HI_GAIN, and thus the output of flip-flop 112, are high. In an instance in which an edge of REFLCK arrives before a corresponding edge of DIVCLK, flip-flop 94 causes the Up signal to go high. The Up signal also causes the output of NAND gate 110 to go low, which in turn holds flip-flops 98 and 100 in the reset state via AND gate 108. Holding flip-flops 98 and 100 in the reset state prevents the rising edge of DIVCLK from triggering flip-flop 98. The next or second rising edge of REFCLK causes the inverted output of flip-flop 96 to go low, which in turn causes the output of NAND gate 110 to go high. The high output of NAND gate 110 disables the forced reset of flip-flops 98 and 100 while the next or second rising edge of DIVCLK clocks the output of flip-flop 98 into flip-flop 100.

With both the Up signal and the Down signal high or asserted, the output of AND gate 102 is high, which causes a low signal to be applied to AND gates 104 and 108 via OR gate 114 and NOR gate 116 of reset circuit 92. The resulting low outputs of AND gates 104 and 108 reset flip-flops 94, 96, 98 and 100. At that time, master portion 38 is ready to receive the next rising edge of REFCLK or DIVCLK. Although the operation of master portion 38 described above relates to an instance in which a rising edge of REFCLK leads a corresponding rising edge of DIVCLK, it should be understood that master portion 38 operates in a similar manner in an instance in which a rising edge of DIVCLK leads a corresponding rising edge of REFCLK.

In high-gain mode, in an instance in which the time difference (or phase error) between corresponding edges of REFCLK and DIVCLK is less than the propagation delay through flip-flop 94 or 98 plus the propagation delay through NAND gate 106 or 110 plus the propagation delay through AND gate 104 or 108, then the later of the REFCLK and DIVCLK edges will not be inhibited, i.e., it will clock flip-flop 94 or 98, and master portion 38 will operate in a manner similar to that in which a conventional PFD operates. In normal operational mode (i.e., HI_GAIN is low or not asserted), the outputs of both NAND gates 106 and 110 are high, and master portion 38 operates in a manner similar to that in which a conventional PFD operates regardless of the time difference (or phase error) between REFCLK and DIVCLK.

When HI_GAIN is de-asserted to indicate a change from hi-gain mode to normal operational mode, flip-flop 112 synchronizes HI_GAIN to Up and Down pulse generators 88 and 90 by allowing the output of flip-flop 112 to reflect the changed mode only after the reset signal produced by NOR gate 116 goes high. This prevents the Up or Down signals from being prematurely reset.

Figure 8A:
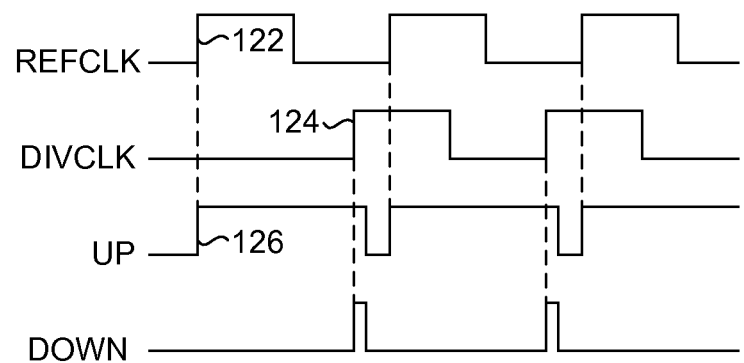
FIG. 8A is a timing diagram, illustrating a potential error condition during startup of a PLL.
Figure 8B:
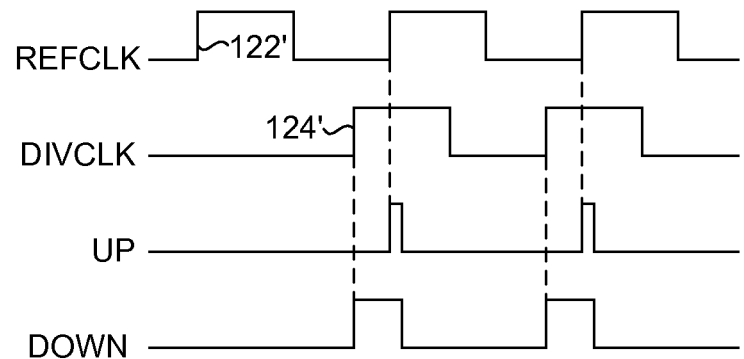
FIG. 8B is a timing diagram similar to FIG. 8A, illustrating PLL operation without the error condition shown in FIG. 8A.

Reset circuit 92 includes two additional AND gates 118 and 120 that generate a special reset signal to prevent master portion 38 from starting in an erroneous state during initial start-up (following application of power and assertion of the STARTUP signal). As illustrated in FIG. 8A, it is possible during initial start-up for the first or initial rising edge 122 of REFCLK to precede the first or initial rising edge 124 of DIVCLK. Absent being prevented by AND gates 118 and 120, a rising edge of REFLCK preceding a rising edge of DIVCLK would erroneously cause master portion 38 to produce a rising edge 126 of the Up signal. Rising edge 126 of the Up signal could, in turn, cause the PLL phase to be adjusted in the wrong direction, resulting in a longer rather than shorter time to acquire phase lock. To adjust the PLL in the correct direction, the Up and Down signals should behave as shown in FIG. 8B.

Figure 9:
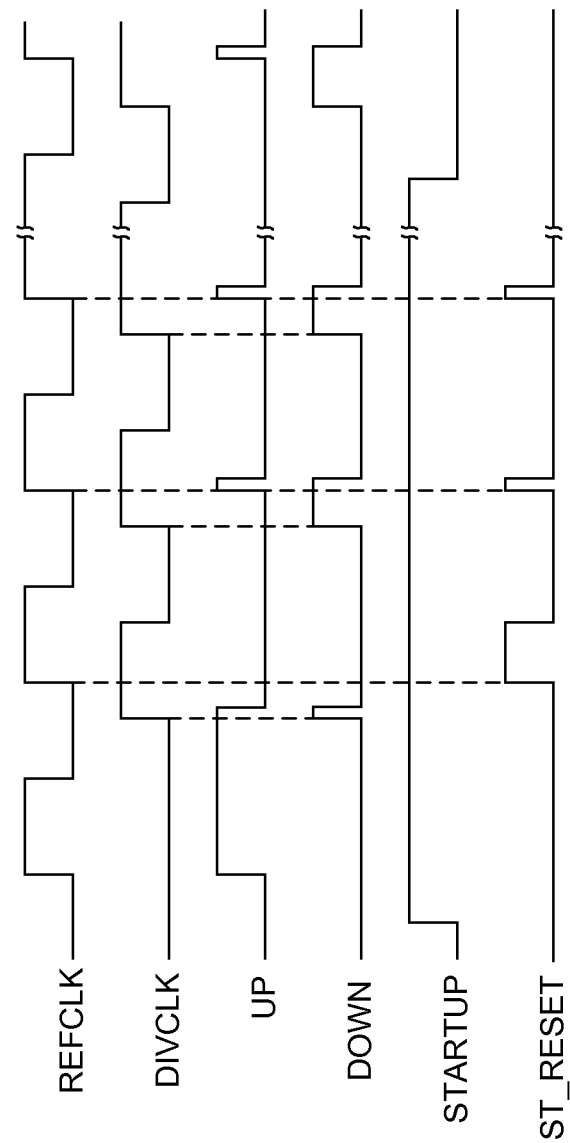
FIG. 9 is a timing diagram similar to FIG. 8B, illustrating the operation of the PFD of FIG. 5.

To prevent the above-described erroneous operation, AND gates 118 and 120 produce a special reset signal that is applied to reset circuit 92 via NOR gate 116 when REFCLK, DIV- CLK and STARTUP are all high. Accordingly, during the initial start-up sequence, after power is applied, start-up circuitry 28 (FIG. 3) asserts STARTUP. After a suitable amount of time, such as a few clock cycles of REFCLK, start-up circuitry 28 de-asserts STARTUP. The resulting effect on the Up and Down signals is shown in FIG. 9.

Figure 10:
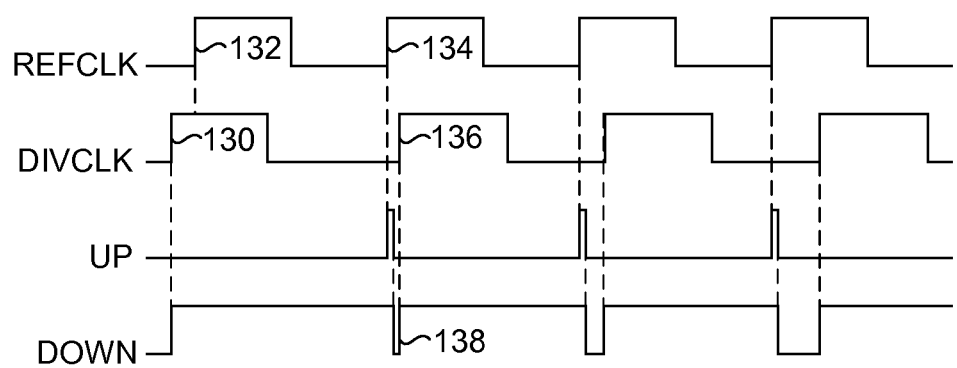
FIG. 10 is a timing diagram, illustrating another potential error condition during startup of a PLL.

Flip-flops 94, 96, 98 and 100 can also be reset by applying a high-gain reset signal (HGRESET) via NOR gate 116. This high-gain reset signal is produced in response to a certain condition at start-up to prevent another potential instance of erroneous operation. Specifically, as illustrated in FIG. 10, at start-up it is possible for an edge 130 of DIVCLK to occur before an edge 132 of REFCLK while DIVCLK is lower in frequency than REFCLK. Absent applying HGRESET to account for this condition, PFD master portion 38 would erroneously drive the PLL output signal to increase in frequency rather than decrease. In this condition, master portion 38 would cause the Down signal to go high and remain high until the second rising edge 134 of REFCLK. At that time, REFCLK would be leading DIVCLK. However, due to the timing, master portion 38 has just exited the reset state, and the first edge 136 of DIVCLK after exiting the reset state would then be trailing the corresponding edge 134 of REFCLK, resulting in an erroneous assertion (i.e., rising edge 138) of the Down signal. This erroneous condition will continue until the Down signal becomes phase-aligned again with REFCLK (but at the wrong frequency). Such an error condition can undesirably increase the time required for PLL 30 to start up.

Figure 11:
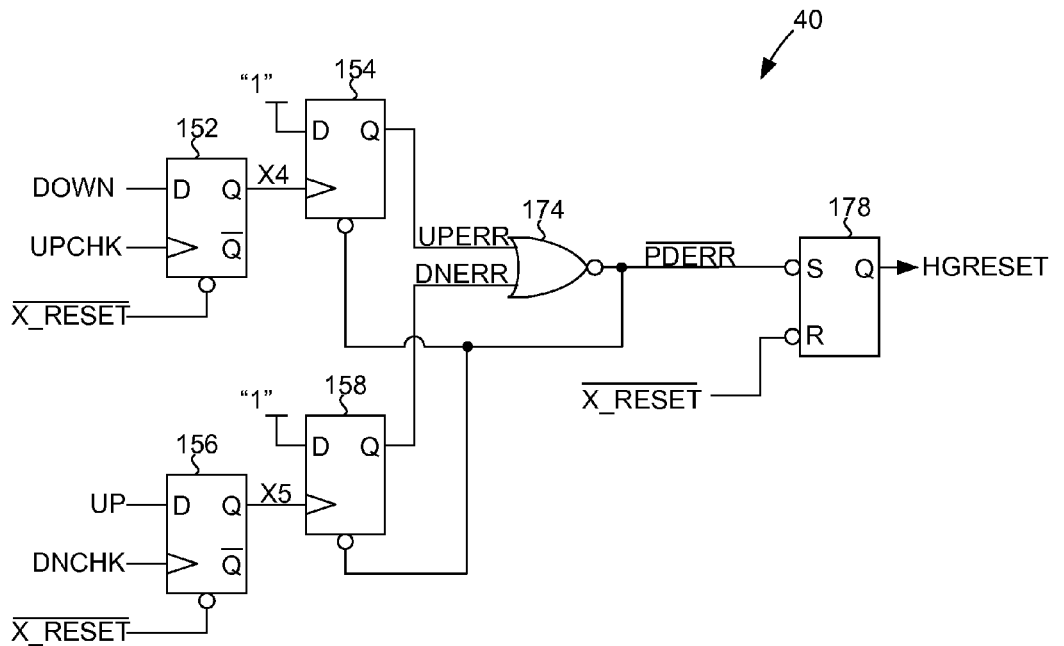
FIG. 11 is a circuit diagram of the control portion of the PFD of FIG. 5 that prevents the potential error condition shown in FIG. 11.
Figure 11:
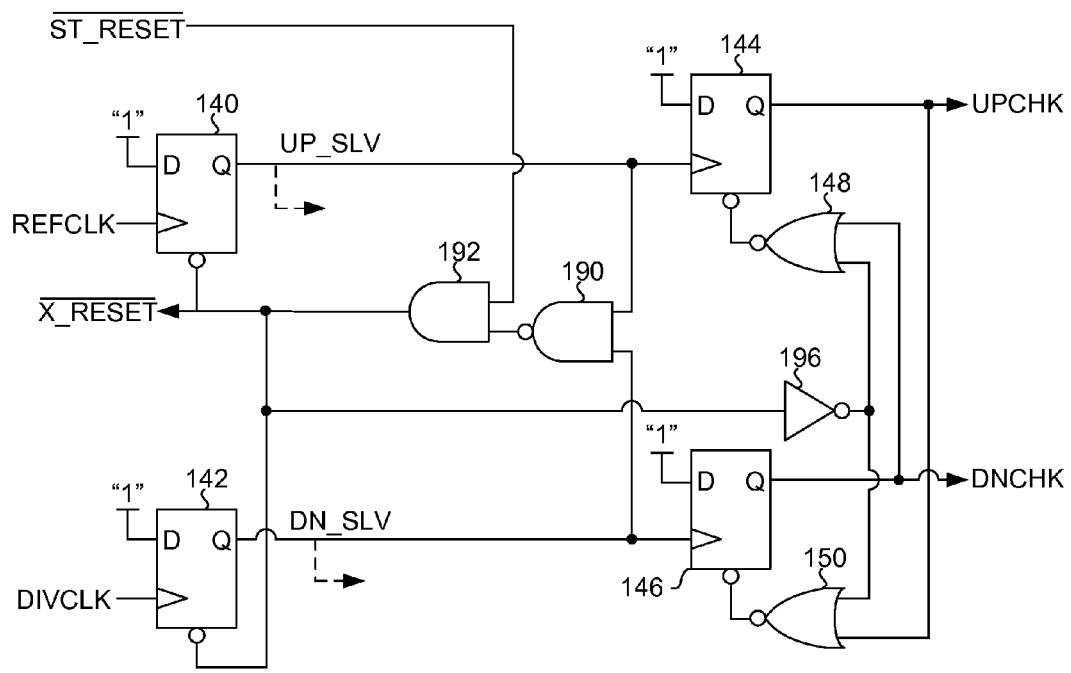

As illustrated in FIG. 11, control portion 40 (FIG. 5) monitors for the above-described error condition and generates HGRESET if the condition is detected. That is, control portion 40 monitors for a start-up condition in which an edge of DIVCLK occurs before an edge of REFCLK while DIVCLK is lower in frequency than REFCLK. Control portion 40 includes flip-flops 140 and 142 that are clocked by REFCLK and DIVCLK, respectively, in the same manner as flip-flops 94 and 98 of master portion 38. The functions of flip-flops 140 and 142 thus mirror the functions of flip-flops 94 and 98 and, accordingly, provide corresponding or slave versions (UP_SLV and DN_SLV) of the Up and Down signals. The UP_SLV signal is provided to the clock input of a flip-flop 144, and the DN_SLV signal is provided to the clock input of a flip-flop 146. In some embodiments, the UP_SLV and DN_SLV signals can also be used externally to PFD 32 (as indicated in broken line) for additional purposes, as described below. The D inputs of flip-flops 144 and 146 receive a fixed logic-"1" signal. A NOR gate 148 couples the output signal (DNCHK) produced by flip-flop 146 to the reset input of flip-flop 144. Likewise, another NOR gate 150 couples the output signal (UPCHK) produced by flip-flop 144 to the reset input of flip-flop 146. Thus, the first rising edge to arrive of UP_SLV from flip-flop 140 or DN_SLV from flip-flop 142 will cause one of flip-flops 144 or 146 to produce an output UPCHK or DNCHK that will prevent the other of flip-flops 144 and 146 from being clocked by the next rising edge of UP_SLV or DN_SLV. Thus, for any pair of REFCLK and DIVCLK edges, only one rising edge of either UPCHK or DNCHK will be output from flip-flops 144 and 146, respectively. Two flip-flops 152 and 154 are used to produce an error signal (UPERR) in response to UPCHK, as described below. Two other flip-flops 156 and 158 are used to produce another error signal (DNERR) in response to DNCHK, as also described below.

Figure 12:
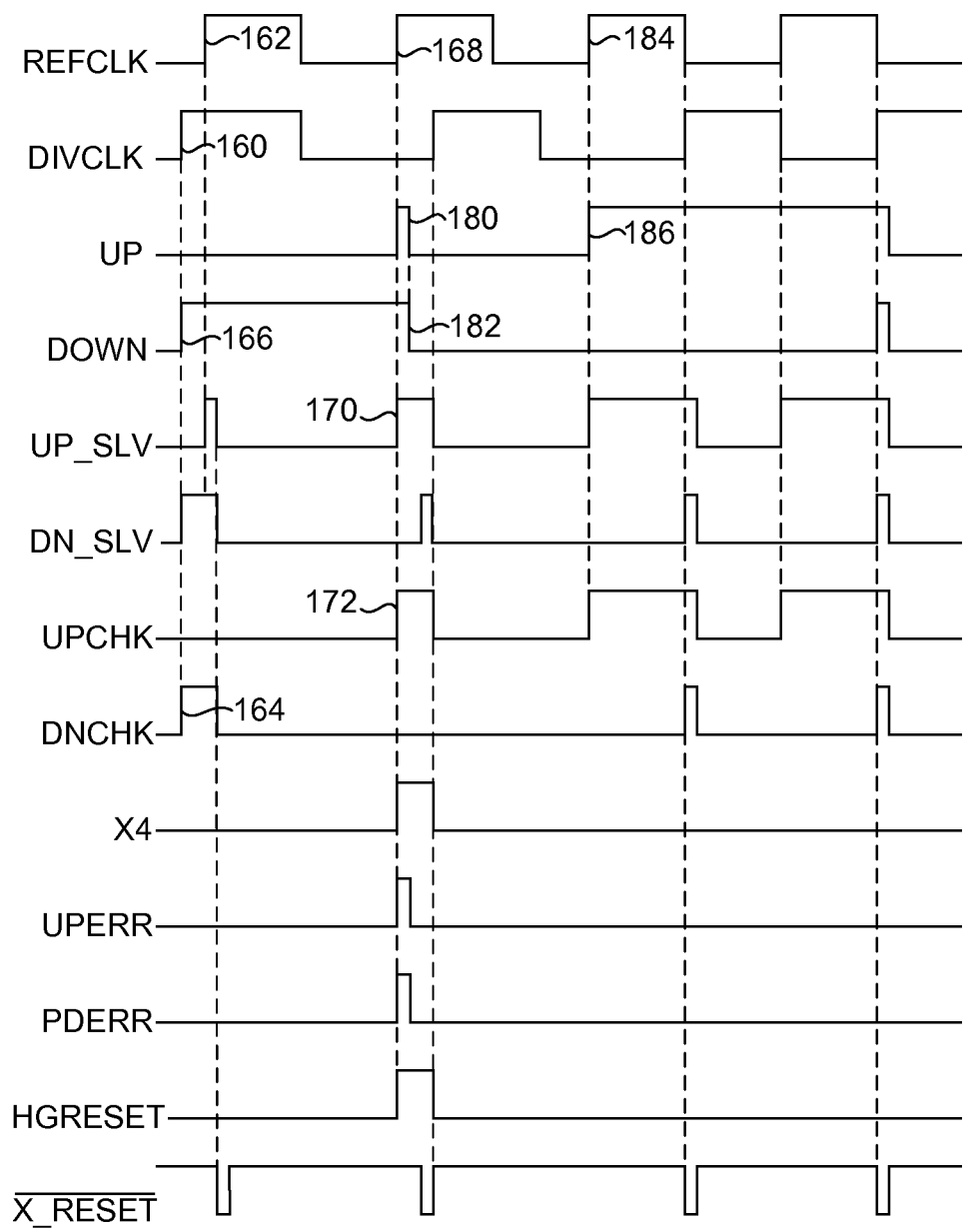
FIG. 12 is a timing diagram, illustrating the operation of the master and control portions of the PFD of FIG. 5.

For example, as illustrated in FIG. 12, in an instance in which a rising edge 160 of DIVCLK leads a corresponding rising edge 162 of REFCLK, DNCHK goes high (rising edge 164) at start-up and clocks the Up signal into flip-flop 156. Absent the operation of control portion 40, the Down signal would erroneously be asserted (at rising edge 166) for an extended period of time. However, at the second rising edge 168 of REFCLK, flip-flop 140 asserts UP_SLV (at rising edge 170), which in turn clocks UPCHK high (at rising edge 172). The UPCHK signal clocks the Down signal (then high) into flip-flop 152. The rising edge produced by flip-flop 152 (signal X4) in turn clocks flip-flop 154 high. The output of flip-flop 154 (UPERR) causes HGRESET to go high, via a NOR gate 174 and a set-reset (S-R) flip-flop 178. As described above, HGRESET prevents a potential error condition by causing flip-flops 94 and 98 to be reset and thus for the Up and Down signals to go low (at falling edges 180 and 182, respectively). With both the Up and Down signals low, the next rising edge 184 of REFCLK causes the Up signal to go high (at rising edge 186), which results in correct PLL operation.

The output of NOR gate 174 ($\overline{PDERR}$) is also used to reset flip-flops 154 and 158. Flip-flops 140, 142, 144, 146, 152 and 156 are reset by logic comprising a NAND gate 190 and an AND gate 192 that generates an active-low reset signal $\overline{X\_RESET}$. More specifically, when both UP_SLV and DN_SLV are high, a reset signal will be applied to flip-flops 140, 142, 144, 146, 152 and 156 when the inverted output of AND gate 120 (FIG. 7) is asserted during start-up. The same reset signal $\overline{X\_RESET}$ is used to reset flip-flops 144 and 146 via an inverter 196 and NOR gates 148 and 150.

Figure 13:
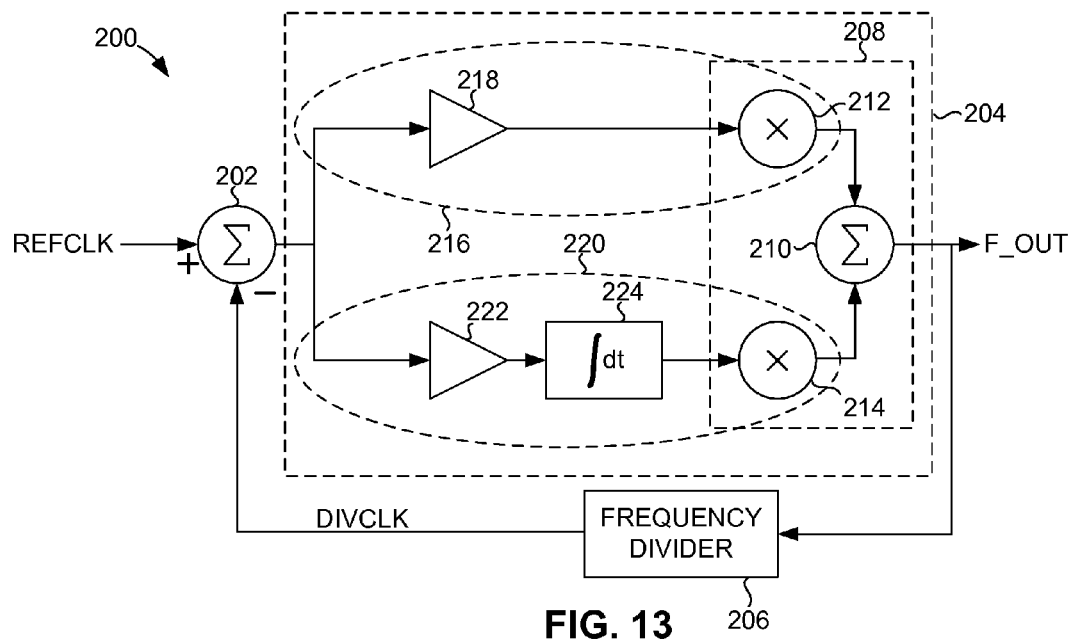
FIG. 13 is a block diagram of a conventional dual-path PLL.

Control portion 40 is not only useful for preventing the error condition described above, but it also can be useful in an embodiment in which the PLL is of a dual-path type. As shown in FIG. 13, a conventional dual-path PLL 200 includes a conventional PFD (i.e., essentially a summer) 202, PLL loop circuitry 204, and a frequency divider 206. The PLL loop circuitry 204 includes a VCO 208, which is represented in generalized form by a summation element 210 and two multiplication elements 212 and 214. The PLL loop circuitry 204 has a proportional path 216, which includes an amplifier 218 and multiplier 212, and an integrating path 220, which includes a charge pump 222, an integrator 224 and multiplier 214. Multipliers 212 and 214 multiply their input signals by gain constants (not shown). The VCO 208 produces the PLL output signal F_OUT. Frequency divider 206 divides F_OUT in frequency and provides a divided-frequency signal (DIVCLK) to PFD 202, which essentially subtracts the divided-frequency signal from a reference clock (REFCLK).

Figure 14:
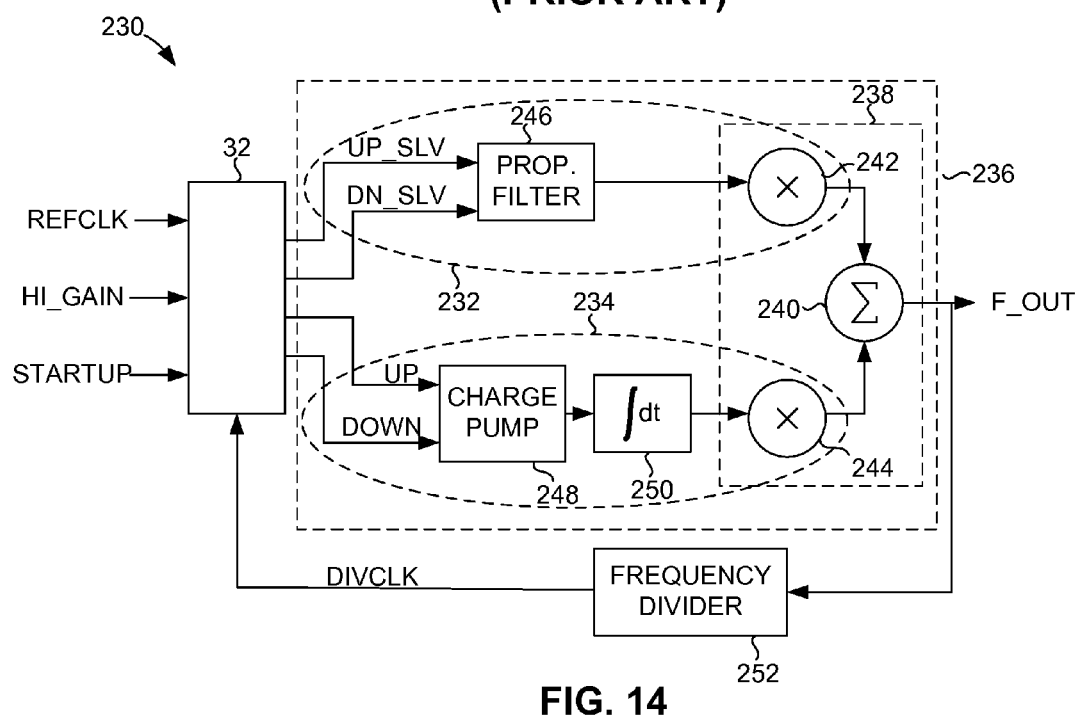
FIG. 14 is a block diagram of a dual-path PLL, in which the PFD of FIG. 5 is employed, in accordance with an exemplary embodiment of the invention.

As illustrated in FIG. 14, in a dual-path PLL 230 in accordance with another embodiment of the present invention, the UP_SLV and DN_SLV signals produced by PFD 32 can be used to control the proportional path 232, and the Up and Down signals produced by master portion 38 of PFD 32 can be used to control the integrating path 234. The PLL loop circuitry 236 includes a VCO 238, which is represented in generalized form by a summation element 240 and two multiplication elements 242 and 244. Proportional path 232 includes a proportional filter 246 and multiplier 242. Integrating path 234 includes a charge pump 248, an integrator 250 and multiplier 244. A frequency divider 252 divides the PLL output signal produced by VCO 238 (F_OUT) and provides a divided-frequency signal (DIVCLK) to PFD 32. Proportional filter 246 generates an output voltage that is proportional to the time difference between the Up and Down pulse widths (i.e., Up-Down). Charge pump 248 and integrator 250 operate in the conventional manner in response to the Up and Down signals. That is, charge pump 248 drives current into integrator 250 in response to the Up signal and draws current from integrator 250 in response to the Down signal.

As noted above, flip-flops 140 and 142 of control portion 40 (FIG. 5) mirror flip-flops 94 and 98 of master portion 38 (FIG. 7) and, accordingly, flip-flops 140 and 142 produce corresponding or slave versions UP_SLV and DN_SLV of the Up and Down signals produced by flip-flops 94 and 98. In this embodiment, PFD 32 is operated in high-gain mode, so that the Up and Down signals provide high-gain PLL operation via integrating path 234, while the UP_SLV and DN_SLV signals provide normal, i.e., lower gain, PLL operation via proportional path 232. Operating integrating path 234 in high-gain mode and proportional path 232 in a lower-gain mode promotes the integrating control voltage reaching a quiescent operating point more rapidly than in a conventional PLL 200 while avoiding potential frequency jitter that could occur if both paths were operated in high-gain mode.

One or more illustrative or exemplary embodiments of the invention have been described above. However, it is to be understood that the invention is defined by the appended claims and is not limited to the specific embodiments described.

What is claimed is:

1. A dual-path phase-locked loop (PLL), comprising:
   PLL loop circuitry comprising proportional path circuitry and integrating path circuitry, the proportional path circuitry operating in response to a first Up signal and a first Down signal, the integrating path circuitry operating in response to a second Up signal and a second Down signal, the PLL loop circuitry providing a PLL output signal and a feedback signal in response to an output of the proportional path circuitry and an output of the integrating path circuitry; and
   a phase-frequency detector (PFD) providing the first Up signal, first Down signal, second Up signal and second Down signal in response to a reference clock signal and the feedback signal;
   wherein the first Up signal is defined by a first Up pulse having a first Up starting edge triggered by a reference clock signal edge and having a first Up ending edge triggered by a combination of the Up signal asserted and the Down signal asserted, and the first Down signal is defined by a first Down pulse having a first Down starting edge triggered by a feedback signal edge and having a first Down ending edge triggered by a combination of the Up signal asserted and the Down signal asserted; and
   wherein when the reference clock signal edge leads the feedback signal edge the second Up signal is defined by a second Up pulse having a second Up starting edge triggered by the reference clock signal edge and having a second Up ending edge triggered by another feedback signal edge following the feedback signal edge, and when the feedback signal edge leads the reference clock signal edge the second Down signal is defined by a second Down pulse having a second Down starting edge triggered by the feedback signal edge and having a second Down ending edge triggered by another reference clock signal edge following the reference clock signal edge.

2. A phase-locked loop (PLL), comprising:
   PLL loop circuitry providing a PLL output signal and a feedback signal in response to an Up signal and a Down signal;
   a phase-frequency detector (PFD) providing the Up signal and Down signal in response to a reference clock signal, the feedback signal, and a mode signal;
   wherein when the mode signal does not indicate a high-gain mode, the Up signal is defined by an Up pulse having an Up starting edge triggered by a reference clock signal edge and having an Up ending edge triggered by a combination of the Up signal asserted and the Down signal asserted, and the Down signal is defined by a Down pulse having a Down starting edge triggered by a feedback signal edge and having a Down ending edge triggered by a combination of the Up signal asserted and the Down signal asserted; and
   wherein when the mode signal indicates the high-gain mode and the reference clock signal edge leads the feedback signal edge the Up signal is defined by the Up pulse having the Up starting edge triggered by the reference clock signal edge and having the Up ending edge triggered by another feedback signal edge following the feedback signal edge, and when the mode signal indicates the high-gain mode and the feedback signal edge leads the reference clock signal edge the Down signal is defined by the Down pulse having the Down starting edge triggered by the feedback signal edge and having the Down ending edge triggered by another reference clock signal edge following the reference clock signal edge.

3. The PLL of claim 2, wherein the PFD comprises:
   an Up pulse generator circuit having a first plurality of flip-flops clocked in response to the reference clock signal;
   a Down pulse generator circuit having a second plurality of flip-flops clocked in response to the feedback signal; and
   reset logic providing a reset signal to the Up pulse generator circuit and the Down pulse generator circuit.

4. The PLL of claim 3, wherein:
   the Up pulse generator comprises a first flip-flop clocked by the reference clock signal and a second flip-flop clocked by the reference clock signal, an output of the first flip-flop being provided to an input of the second flip-flop, an output of the first flip-flop defining the Up signal;
   the Down pulse generator comprises a third flip-flop clocked by the feedback signal and a fourth flip-flop clocked by the feedback signal, an output of the third flip-flop being provided to an input of the fourth flip-flop, an output of the third flip-flop defining the Down signal;
   the PFD reset logic provides the reset signal to the first, second, third and fourth flip-flops in response to an output of the second and fourth flip-flops.

5. The PLL of claim 4, wherein the reset logic resets the first, second, third and fourth flip-flops in response to the Up signal and the Down signal when the mode signal does not indicate the high-gain mode, resets the first and second flip-flops in response to the Down signal and the output of the fourth flip-flop when the mode signal indicates the high-gain mode, and resets the third and fourth flip-flops in response to the Up signal and the output of the second flip-flop when the mode signal indicates the high-gain mode.

6. The PLL of claim 4, wherein the reset logic further resets a plurality of the first, second, third and fourth flip-flops in response to the reference clock signal, the feedback signal, and a startup signal indicating a beginning of PLL operation.

7. The PLL of claim 6, further comprising control logic detecting a condition wherein immediately following the startup signal indicating the beginning of PLL operation the mode signal indicates a high-gain mode, and a feedback signal edge leads a reference clock signal edge, and the control logic resets a plurality of the first, second, third and fourth flip-flops in response to detection of the condition.

8. The PLL of claim 7, wherein the control logic comprises:
a fifth flip-flop clocked by the reference clock signal, a sixth flip-flop clocked by an output of the fifth flip-flop, a seventh flip-flop clocked by the feedback signal, and an eighth flip-flop clocked by an output of the seventh flip-flop; and
control logic reset logic resetting the sixth flip-flop in response to an output of the eighth flip-flop and resetting the eighth flip-flop in response to an output of the sixth flip-flop; and
wherein a plurality of flip-flops of the Up pulse generator circuit and the Down pulse generator circuit are reset in response to the high-gain reset signal.

9. The PLL of claim 8, wherein the control logic further comprises:
a ninth flip-flop having an input receiving the Down signal and clocked by the output of the sixth flip-flop, a tenth flip flop clocked by the output of the ninth flip-flop, an eleventh flip-flop receiving the Up signal and clocked by the output of the eighth flip-flop, and a twelfth flip-flop clocked by an output of the eleventh flip-flop; and
wherein the high-gain reset signal is produced in response to an output of the tenth flip-flop and an output of the twelfth flip-flop.

10. A method of operation in a phase-locked loop (PLL), comprising:
providing a PLL output signal in a PLL feedback loop in response to an Up signal and a Down signal;
providing a feedback signal in response to the PLL output signal;
providing the Up signal and the Down signal in response to a reference clock signal, the feedback signal, and a mode signal;
wherein when the mode signal does not indicate a high-gain mode, the Up signal is defined by an Up pulse having an Up starting edge triggered by a reference clock signal edge and having an Up ending edge triggered by a combination of the Up signal asserted and the Down signal asserted, and the Down signal is defined by a Down pulse having a Down starting edge triggered by a feedback signal edge and having a Down ending edge triggered by a combination of the Up signal asserted and the Down signal asserted; and
wherein when the mode signal indicates the high-gain mode and the reference clock signal edge leads the feedback signal edge the Up signal is defined by the Up pulse having the UP starting edge triggered by the reference clock signal edge and having the Up ending edge triggered by another feedback signal edge following the feedback signal edge, and when the mode signal indicates the high-gain mode and the feedback signal edge leads the reference clock signal edge the Down signal is defined by the Down pulse having the Down starting edge triggered by the feedback signal edge and having the Down ending edge triggered by another reference clock signal edge following the reference clock signal edge.

11. The method of claim 10, wherein providing the Up signal and the Down signal comprises:
generating the Up pulse using an Up pulse generator comprising a first plurality of flip-flops clocked in response to the reference clock signal and generating the Down pulse using a Down pulse generator comprising a second plurality of flip-flops clocked in response to the feedback signal; and
providing a reset signal to the first and second plurality of flip-flops.

12. The method of claim 11, wherein:
the Up pulse generator comprises a first flip-flop clocked by the reference clock signal and a second flip-flop clocked by the reference clock signal, an output of the first flip-flop being provided to an input of the second flip-flop, an output of the first flip-flop defining the Up signal;
the Down pulse generator comprises a third flip-flop clocked by the feedback signal and a fourth flip-flop clocked by the feedback signal, an output of the third flip-flop being provided to an input of the fourth flip-flop, an output of the third flip-flop defining the Down signal; and
providing a reset signal comprises providing the reset signal to the first, second, third and fourth flip-flops in response to an output of the second and fourth flip-flops.

13. The method of claim 12, wherein providing a reset signal comprises resetting the first, second, third and fourth flip-flops in response to the Up signal and the Down signal when the mode signal does not indicate the high-gain mode, resetting the first and second flip-flops in response to the Down signal and the output of the fourth flip-flop when the mode signal indicates the high-gain mode, and resetting the third and fourth flip-flops in response to the Up signal and the output of the second flip-flop when the mode signal indicates the high-gain mode.

14. The method of claim 12, wherein providing a reset signal further comprises resetting a plurality of the first, second, third and fourth flip-flops in response to the reference clock signal, the feedback signal, and a startup signal indicating a beginning of PLL operation.

15. The method of claim 13, wherein providing a reset signal comprises:
detecting a condition wherein immediately following the startup signal indicating the beginning of PLL operation the mode signal indicates a high-gain mode and a feedback signal edge leads a reference clock signal edge; and
resetting a plurality of the first, second, third and fourth flip-flops in response to detection of the condition.

16. An integrated circuit device having a phase-locked loop (PLL), the integrated circuit device comprising:
startup circuitry providing a mode signal indicating a high-gain mode when power is initially applied to the PLL and not indicating the high-gain mode after an initial startup period following initial application of power;
PLL loop circuitry providing a PLL output signal and a feedback signal in response to an Up signal and a Down signal;
a phase-frequency detector (PFD) providing the Up signal and Down signal in response to a reference clock signal, the feedback signal, and the mode signal;
wherein when the mode signal does not indicate the high-gain mode, the Up signal is defined by an Up pulse having an Up starting edge triggered by a reference clock signal edge and having an Up ending edge triggered by a combination of the Up signal asserted and the Down signal asserted, and the Down signal is defined by a Down pulse having a Down starting edge triggered by a feedback signal edge and having a Down ending edge triggered by a combination of the Up signal asserted and the Down signal asserted; and wherein when the mode signal indicates the high-gain mode and the reference clock signal edge leads the feedback signal edge the Up signal is defined by the Up pulse having the Up starting edge triggered by the reference clock signal edge and having the Up ending edge triggered by another feedback signal edge following the feedback signal edge, and when the mode signal indicates the high-gain mode and the feedback signal edge leads the reference clock signal edge the Down signal is defined by the Down pulse having the Down starting edge triggered by the feedback signal edge and having the Down ending edge triggered by another reference clock signal edge following the reference clock signal edge.

17. The integrated circuit device of claim 16, wherein the PFD comprises:
   an Up pulse generator circuit having a first plurality of flip-flops clocked in response to the reference clock signal;
   a Down pulse generator circuit having a second plurality of flip-flops clocked in response to the feedback signal; and
   PFD reset logic providing a reset signal to the Up pulse generator circuit and the Down pulse generator circuit.

18. The integrated circuit device of claim 17, wherein:
   the Up pulse generator comprises a first flip-flop clocked by the reference clock signal and a second flip-flop clocked by the reference clock signal, an output of the first flip-flop being provided to an input of the second flip-flop, an output of the first flip-flop defining the Up signal;
   the Down pulse generator comprises a third flip-flop clocked by the feedback signal and a fourth flip-flop clocked by the feedback signal, an output of the third flip-flop being provided to an input of the fourth flip-flop, an output of the third flip-flop defining the Down signal; and
   the PFD reset logic provides the reset signal to the first, second, third and fourth flip-flops in response to an output of the second and fourth flip-flops.

19. A method of operation in an integrated circuit device having a phase-locked loop (PLL), the method comprising:
   applying power to the integrated circuit device;
   immediately after applying power to the integrated circuit device, providing a mode signal indicating a high-gain mode;
   providing a PLL output signal in response to an Up signal and a Down signal;
   providing a feedback signal in response to the PLL output signal;
   providing the Up signal and Down signal in response to a reference clock signal, the feedback signal, and the mode signal, wherein when the mode signal indicates the high-gain mode and the reference clock signal edge leads the feedback signal edge the Up signal is defined by an Up pulse having an Up starting edge triggered by the reference clock signal edge and having an Up ending edge triggered by another feedback signal edge following the feedback signal edge, and when the mode signal indicates the high-gain mode and the feedback signal edge leads the reference clock signal edge the Down signal is defined by a Down pulse having a Down starting edge triggered by the feedback signal edge and having a Down ending edge triggered by another reference clock signal edge following the reference clock signal edge; and
   after an initial startup period following initial application of power to the integrated circuit device, changing the mode signal to indicate a normal operational mode instead of the high-gain mode;
   wherein when the mode signal indicates the normal operational mode, the Up signal is defined by the Up pulse having the Up starting edge triggered by a reference clock signal edge and having the Up ending edge triggered by a combination of the Up signal asserted and the Down signal asserted, and the Down signal is defined by the Down pulse having the Down starting edge triggered by a feedback signal edge and having the Down ending edge triggered by a combination of the Up signal asserted and the Down signal asserted.

* * * * *